United States Patent
Rho et al.

(10) Patent No.: US 7,868,332 B2
(45) Date of Patent: Jan. 11, 2011

(54) HIGH LUMINANCE LIGHT EMITTING DIODE AND LIQUID CRYSTAL DISPLAY DEVICE USING THE SAME

(75) Inventors: Soo-Guy Rho, Suwon-si (KR); Kyu-Seok Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 498 days.

(21) Appl. No.: 11/595,604

(22) Filed: Nov. 9, 2006

(65) Prior Publication Data

US 2007/0145383 A1 Jun. 28, 2007

(30) Foreign Application Priority Data

Nov. 10, 2005 (KR) ...................... 10-2005-0107391

(51) Int. Cl.
*H01L 27/15* (2006.01)
(52) U.S. Cl. .............................. 257/79; 257/98; 257/99; 257/100; 257/E25.02; 257/E33.07
(58) Field of Classification Search .................. 257/79, 257/98–100
See application file for complete search history.

(56) References Cited

U.S. PATENT DOCUMENTS

| | | | |
|---|---|---|---|
| 4,943,143 A * | 7/1990 | Yamashita ..................... | 349/48 |
| 5,660,461 A | 8/1997 | Ignatius et al. | |
| 6,858,869 B2 | 2/2005 | Fujiwara | |
| 2004/0056990 A1 * | 3/2004 | Setlur et al. ................... | 349/69 |
| 2005/0001952 A1 * | 1/2005 | Han et al. ...................... | 349/65 |
| 2005/0024847 A1 | 2/2005 | Ahn et al. | |
| 2006/0006404 A1 * | 1/2006 | Ibbetson et al. ............... | 257/99 |
| 2006/0124947 A1 * | 6/2006 | Mueller et al. ................ | 257/98 |
| 2006/0163596 A1 * | 7/2006 | Kim et al. ...................... | 257/98 |
| 2007/0012936 A1 * | 1/2007 | Zeng et al. ..................... | 257/98 |
| 2007/0081329 A1 * | 4/2007 | Chua et al. .................... | 362/231 |

FOREIGN PATENT DOCUMENTS

| | | |
|---|---|---|
| CN | 1538534 A | 10/2004 |
| CN | 1758436 A | 4/2006 |
| JP | 10-288966 | * 10/1998 |
| JP | 2002-50798 | 2/2002 |
| JP | 2002-82635 | 3/2002 |
| JP | 2005-101660 | 4/2005 |
| JP | 2005-513551 | 5/2005 |
| KR | 2003-0088882 | 11/2003 |
| KR | 2004-0029684 | 4/2004 |

(Continued)

OTHER PUBLICATIONS

Patent Abstracts of Japan, Publication No. 2002-050798, Feb. 15, 2002, 1 p.

(Continued)

*Primary Examiner*—A. Sefer
(74) *Attorney, Agent, or Firm*—Innovation Counsel LLP

(57) ABSTRACT

A light emitting diode (LED) is provided with a base substrate, a plurality of light emitting chips disposed on the upper surface of the base substrate and electrically coupled in parallel to one another, and a fluorescent material layer for covering the light emitting chips.

12 Claims, 7 Drawing Sheets

FOREIGN PATENT DOCUMENTS

| | | |
|---|---|---|
| KR | 2004-0088446 | 10/2004 |
| KR | 2004-0092141 | 11/2004 |
| KR | 2004-0097881 | 11/2004 |
| KR | 2005-0013769 | 2/2005 |
| KR | 2005-0016775 | 2/2005 |
| KR | 2005-0064454 | 6/2005 |
| WO | WO 2005/106978 | * 11/2005 |

OTHER PUBLICATIONS

Patent Abstracts of Japan, Publication No. 2002-082635, Mar. 22, 2002, 1 p.
Patent Abstracts of Japan, Publication No. 2005-101660, Apr. 14, 2005, 1 p.
Patent Abstracts of Japan, Publication No. 2005-513551, May 12, 2005, 1 p.
Patent Abstracts of Japan, Publication No. 1020030088882, Nov. 20, 2003, 1 p.
Patent Abstracts of Japan, Publication No. 1020040029684, Apr. 8, 2004, 1 p.
Korean Patent Abstracts, Publication No. 1020040088446, Oct. 16, 2004, 1 p.
Korean Patent Abstracts, Publication No. 1020040092141, Nov. 3, 2004, 1 p.
Korean Patent Abstracts, Publication No. 1020040097881, Nov. 18, 2004, 1 p.
Korean Patent Abstracts, Publication No. 1020050014769, Feb. 7, 2005, 1 p.
Korean Patent Abstracts, Publication No. 1020050016775, Feb. 21, 2005, 1 p.
Korean Patent Abstracts, Publication No. 1020050064454, Jun. 29, 2005, 1 p.

* cited by examiner

HIGH LUMINANCE LIGHT EMITTING DIODE AND LIQUID CRYSTAL DISPLAY DEVICE USING THE SAME

CROSS-REFERENCE TO RELATED APPLICATION

This application claims priority to and the benefit of Korean Patent Application No. 10-2005-0107391 filed in the Korean Intellectual Property Office on Nov. 10, 2005, the entire contents of which are incorporated herein by reference.

BACKGROUND OF THE INVENTION (a) Field of the Invention

The present invention relates to a light emitting diode (LED), and more particularly to a high luminance LED that is capable of being used as a backlight of a liquid crystal display device.

(b) Description of the Related Art

Types of display devices that may be used as a computer monitor or a TV include self-illuminating devices such as light emitting diode (LED) displays, electroluminescence (EL) displays, vacuum fluorescent displays (VFDs), field emission displays (FED), or plasma display panels (PDP). Device types also include non-self-illuminating devices that require an additional light source, such as a liquid crystal display (LCD).

A typical liquid crystal display device includes two display panels on which field generating electrodes are formed, and a liquid crystal layer that has dielectric anisotropy and is interposed between the two display panels. A liquid crystal display device applies a voltage to field generating electrodes to generate an electric field in the liquid crystal layer. The applied voltage is changed in order to adjust the intensity of the electric field in the liquid crystal layer, which adjusts the transmittance of light passing through the liquid crystal layer so that a desired image is displayed.

The light may be provided from an artificial light source, or may be natural light.

An artificial light source for the liquid crystal display, such as a backlight device, typically uses a plurality of fluorescent lamps such as cold cathode fluorescent lamps (CCFLs) or external electrode fluorescence lamps (EEFL), or it may use a plurality of LEDs as light sources.

In display devices, the LED has been spotlighted as the light source for next generation backlight devices, since LEDs have a number of beneficial properties. For example, LEDs are environmentally friendly because they do not use mercury. Additionally, LEDs have long lifetimes, because of their structural stability.

However, in order to generate white light using LEDs, a light emitting chip and a fluorescent unit are used. The fluorescent unit converts the light emitted from the light emitting chip into light with a different wavelength distribution. Since the light emitted from one light emitting chip is converted into light of various wavelengths and used as a light source, the LED has a problem in that its overall luminance is low.

The above information disclosed in this Background section is only for enhancement of understanding of the background of the invention and therefore it may contain information that does not form the prior art that is already known in this country to a person of ordinary skill in the art.

SUMMARY OF THE INVENTION

Accordingly, systems and techniques described herein provide a high luminance LED.

According to the current disclosure, light emitting diodes, each including a base substrate having lower and upper surfaces, a plurality of light emitting chips disposed on the upper surface of the base substrate and electrically coupled in parallel to one another, and a fluorescent material layer for covering the light emitting chips are provided.

According to an exemplary embodiment of the present invention, each light emitting diode may further include wires formed on the lower surface of the base substrate to electrically connect the plurality of light emitting chips together in parallel.

The base substrate may have through-holes, and the light emitting diodes may further include plugs for connecting electrodes of the light emitting chips and the wires through the through-holes of the base substrate.

The base substrate may include a PCB substrate and a heat sink substrate attached on the PCB substrate, the wires may be formed on a lower surface of the PCB substrate, and the light emitting chips may be placed on an upper surface of the heat sink substrate.

The heat sink substrate may comprise metal. For example, it may be made entirely of a metal material, may consist essentially of a metal material, or may include a metal material.

The light emitting diodes may each further include one or more chip base films formed on the heat sink substrate to insulate the electrodes of the light emitting chips from the heat sink substrate.

The light emitting diodes may each further include through-hole films formed on at least inner walls of through-holes of the heat sink substrate to insulate the plugs from the heat sink substrate.

The light emitting chips may emit blue light.

The light emitting chips may emit blue light and ultraviolet light.

The fluorescent material layer may include a red fluorescent material and a green fluorescent material.

The light emitting diodes may each further include a molding resin layer covering the fluorescent material layer.

Grooves may be formed on the upper surface of the base substrate, and the light emitting chips may be disposed at least partially inside an associated groove.

The light emitting diodes may each further include a reflecting layer formed on the upper surface of the base substrate.

In addition, a liquid crystal display device including light emitting diodes and a liquid crystal panel that is positioned to receive light from the light emitting diodes and that includes two panels and a liquid crystal layer interposed between the two panels is provided. The light emitting diodes may each include a PCB substrate having lower and upper surfaces and through-holes, wires formed on the lower surface of the PCB substrate, a heat sink substrate having lower and upper surfaces and through-holes aligned with the through holes of the PCB substrate, wherein the lower surface of the heat sink substrate is positioned on the upper surface of the PCB substrate, a plurality of light emitting chips disposed on the upper surface of the heat sink substrate, plugs for connecting electrodes of the light emitting chips and the wires through the through-holes of the heat sink substrate and the PCB substrate, a fluorescent material layer covering the light emitting chips, and a molding resin layer formed on the fluorescent material layer.

The liquid crystal display device may further include two polarizers disposed on respective sides of the liquid crystal panel.

The liquid crystal display device may further include one or more optical films positioned between the light emitting diodes and the liquid crystal panel.

DETAILED DESCRIPTION OF THE EMBODIMENTS

Figure 1:
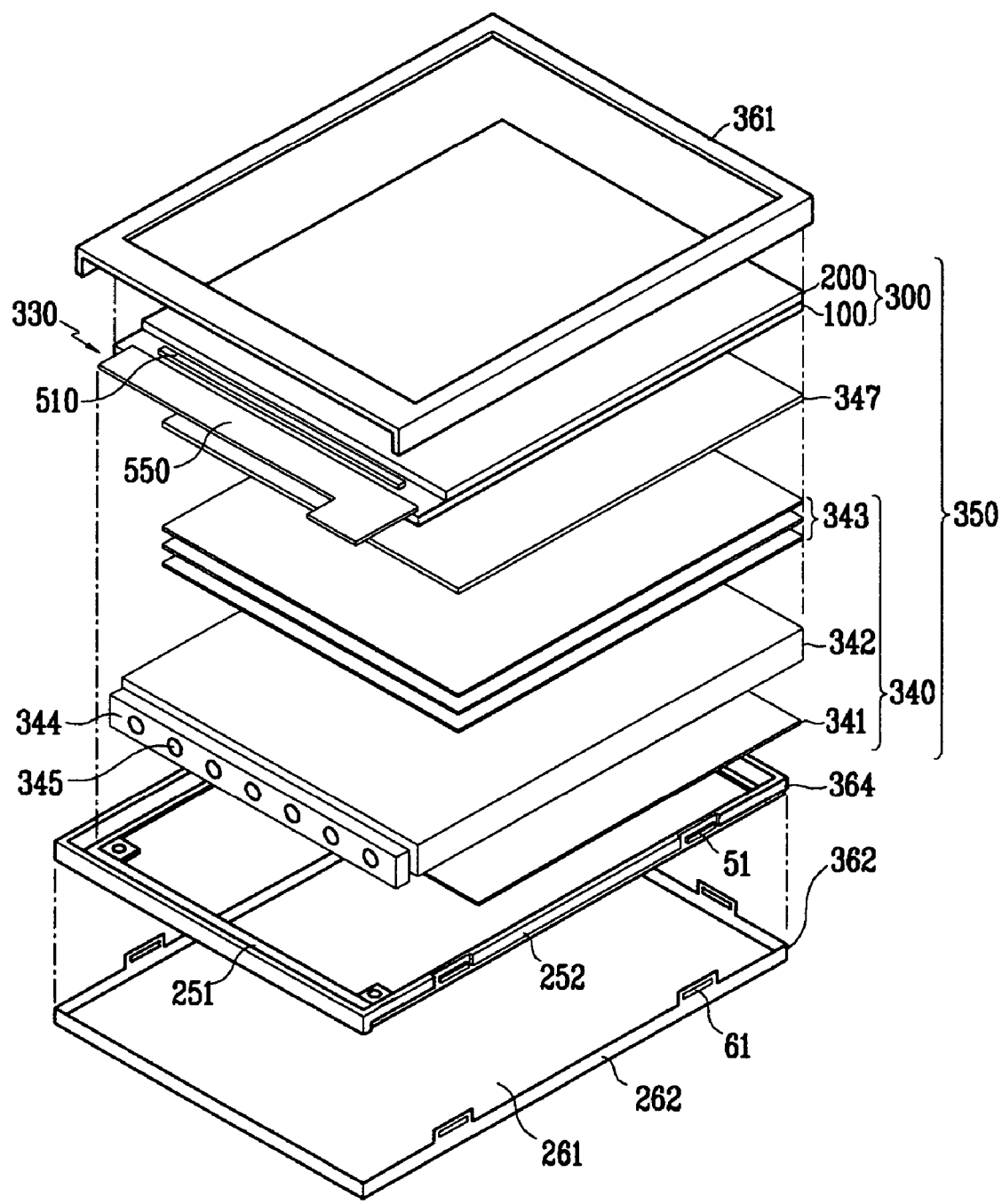
FIG. 1 is an exploded perspective view of a liquid crystal display device according to an exemplary embodiment of the present invention.

An exemplary embodiment of the present invention will hereinafter be described in detail with reference to the accompanying drawings in order that those skilled in the art can easily practice the invention, aspects of which are defined by the claims. The following description is illustrative, and is not intended to limit the claims. Those skilled in the art will recognize that alternative implementation of elements of the following may be used in addition to, or instead of the elements described below, and some elements may be omitted.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present.

First, a light source for a display device according to an exemplary embodiment of the present invention will be described in detail with reference to the accompanying drawings.

FIG. 1 is an exploded perspective view of a liquid crystal display device according to an exemplary embodiment of the present invention.

As shown in FIG. 1, a liquid crystal display device according to an exemplary embodiment of the present invention includes a liquid crystal panel assembly 330 for displaying images using light; a backlight assembly 340 for generating the light; a selective reflecting film 347 interposed between the liquid crystal panel assembly 330 and the backlight assembly 340; a mold frame 364 for housing the liquid crystal panel assembly 330, the selective reflecting film 347, and the backlight assembly 340; and upper and lower sashes 361 and 362.

The liquid crystal panel assembly 330 includes a liquid crystal panel 300 for displaying images, a driving chip 510, and a flexible circuit board 550.

The liquid crystal panel 300 includes a thin film transistor (TFT) array panel 100, a color filter array panel 200 coupled to and facing the TFT array panel 100, and a liquid crystal layer (not shown) interposed between the TFT array panel 100 and the color filter array panel 200.

The TFT array panel 100 has a plurality of pixels (not shown) arranged in a matrix. Each of the pixels is defined by a gate line (not shown) and a data line (not shown) and has a pixel electrode. The gate line extends in a first direction, and the data line extends in a second direction perpendicular to the first direction. The data line is insulated from and crosses the gate line. Also, each pixel has a TFT (not shown) connected to the gate line, data line, and pixel electrode.

The color filter array panel 200 has red, green, and blue color filters (not shown) that are formed in a thin film process and in the described embodiment are predetermined color components of white light. The color filter array panel 200 has a common electrode facing the pixel electrodes.

Molecules of the liquid crystal layer are arranged by the voltage applied between the pixel electrodes and the common electrode, to change the polarization state of the light provided from the backlight assembly 340.

The driving chip 510 is mounted on the first end of the TFT array panel 100 to apply driving signals to the data lines and gate lines. The driving chip 510 may consist of two or more separate chips (e.g., a chip to drive the data line and a chip to drive the gate line), or may consist of one integrated chip. The driving chip 510 is mounted on the TFT array panel 100 by a chip on glass (COG) process.

The flexible circuit board 550 is attached on the first end of the TFT array panel 100 to apply control signals to control the driving chip 510. A timing controller is mounted on the flexible circuit board 550 to adjust the timing of the driving signals and/or to control a memory for storing data signals. The flexible circuit board 550 may be electrically connected to the TFT array panel 100 using an anisotropic conductive film as a medium.

The backlight assembly 340 is formed under the liquid crystal panel assembly 330 to provide sufficiently uniform light to the liquid crystal panel 300.

The backlight assembly 340 includes a light source unit 344 having LEDs 345 for generating light, a light guide 342 for guiding the path of the light, optical sheets 343 for increasing the luminance uniformity of the light emitted from the light guide 342, and a reflector 341 for reflecting light that leaks from the light guide 342.

The LEDs 345 use a white emitting diode as a light source, which may comprise a plurality of blue LED chips coated with green and red fluorescent material. In some embodiments, the LEDs 345 may use a white LED as a base and a red LED as an auxiliary.

The light source unit 344 is disposed at one side of the light guide 342 and provides the light to the light guide 342. The flexible circuit board (not shown) for controlling the LEDs 345 may be attached at one side of the light source unit 344. Although the light source unit 344 is disposed at one side of the light guide 342 in the present exemplary embodiment, the light source unit 344 may be disposed at both sides of the light guide 342, or a plurality of light source units may be disposed under the light guide 342, if necessary. In the latter case, the light guide 342 may be omitted.

The light guide 342 has a light guide pattern (not shown) for guiding the light into the display region of the liquid crystal panel 300 on which images are displayed.

The optical sheets 343 are interposed between the light guide 342 and the liquid crystal panel 300. The optical sheets 343 increase the luminance uniformity of the light provided from the light guide 342; for example, to be substantially uniform when incident on the liquid crystal panel 300.

The reflector 341 is formed under the light guide 342. The reflector 341 reflects light that has leaked from the light guide 342 to the light guide 342, to improve light use efficiency.

The mold frame 364 sequentially houses the reflector 341, the light guide 342, the optical sheets 343, and the liquid crystal panel 300. The mold frame 364 includes an opened bottom surface 251 and side walls 252 extended from the bottom surface 251, and the mold frame 364 is made of synthetic resin.

The flexible circuit board 550 is bent along the side walls 252 of the mold frame 364. A plurality of first coupling protrusions 51 are formed on the side walls 252 of the mold frame 364 to be coupled with the lower sash 362.

The mold frame 364 is housed in the lower sash 362 that is made of a metal material. The lower sash 362 has a bottom plate 261 and side plates 262 extended from the edge of the bottom plate 261 to form a housing space. A plurality of coupling grooves 61 corresponding to the plurality of first coupling protrusions 51 are formed in the side plates 262.

In coupling the mold frame 364 and the lower sash 362, the side plates 262 of the lower sash 362 are partially disposed at the outside of the side walls 252 of the mold frame 364. The plurality of first coupling protrusions 51 are inserted into the plurality of coupling grooves 61 to couple the mold frame 364 and the lower sash 362. Herein, in order to reduce the overall size of the liquid crystal display device, the mold frame 364 is partially thinned by the thickness of the side plates 262 of the lower sash 362 at the contact portion with the side plates 262.

The upper sash 361 is positioned on the upper side of the liquid crystal panel 300. The upper sash 361 covers the liquid crystal panel 300 so as to open the valid display area 300 for displaying images, and is coupled with the lower sash 362. The upper sash 361 guides the position of the liquid crystal panel 300 and fixes the liquid crystal panel 300 into the mold frame 364.

Now, a light source unit 344 according to an exemplary embodiment of the present invention and the LED 345 of the light source unit 344 will be described in detail with reference to FIG. 2 and FIG. 3.

Figure 2:
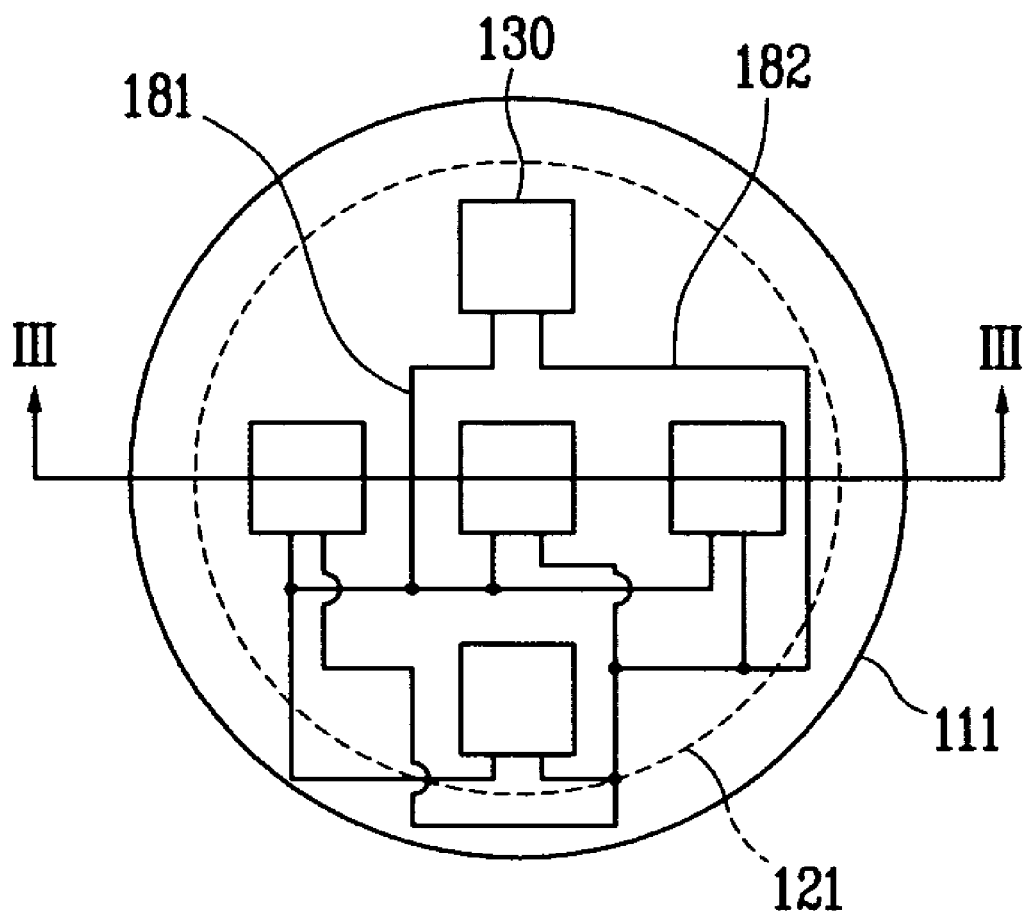
FIG. 2 is a layout view of a light emitting diode (LED) according to an exemplary embodiment of the present invention.
Figure 3:
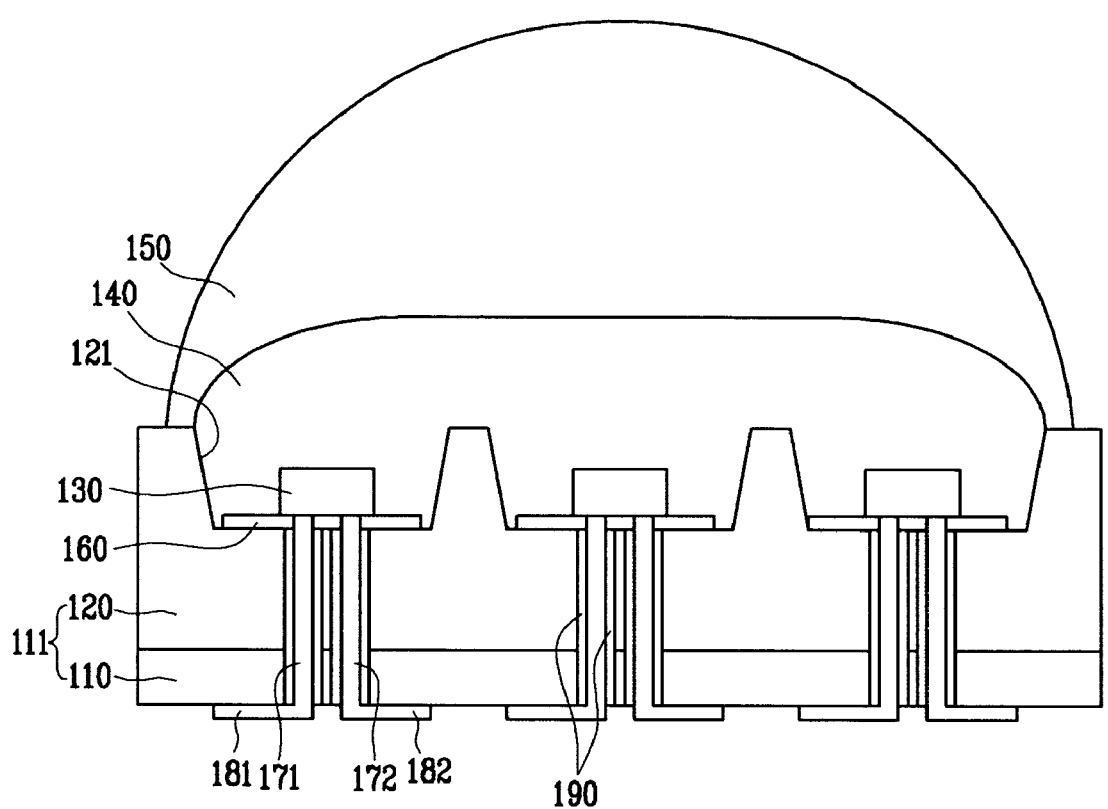
FIG. 3 is a cross-sectional view taken along the line III-III of FIG. 2.

FIG. 2 is a layout view of an LED according to an exemplary embodiment of the present invention, and FIG. 3 is a cross-sectional view taken along the line III-III of FIG. 2.

The LED according to an exemplary embodiment of the present invention includes a base substrate 111 which is a dual substrate consisting of a lower printed circuit board (PCB) substrate 110 and an upper heat sink substrate 120, chip base films 160 formed on the base substrate 111, a plurality of LED chips 130 disposed on the chip base films 160, a fluorescent material layer 140 covering the plurality of LED chips 130, and a molding resin layer 150 formed on the fluorescent material layer 140.

The PCB substrate 110 forming the lower portion of the base substrate 111 has wires 181 and 182 for driving the LED according to an exemplary embodiment of the present invention. The wires may include a wire for providing power to the LED chips 130.

The heat sink substrate 120 forming the upper portion of the base substrate 111 is made of a material having excellent heat conductivity, (for example, a metal such as aluminum), and its bottom surface is attached to the upper surface of the PCB substrate 110. Grooves 121 are formed on the upper surface of the heat sink substrate 120, and the chip base films 160 and the LED chips 130 are placed on the bottom surface of the grooves 121. In some embodiments, the heat sink substrate 120 may be formed of a material having excellent heat conductivity that is not a metal.

Through-holes are formed in the base substrate 111 to penetrate the lower surface of the PCB substrate 110 through the upper surface of the heat sink substrate 120, and plugs 171 and 172 are formed in the through-holes to electrically connect the electrodes of the LED chips 130 and the wires 181 and 182. Through-hole films 190 are formed on the inner surfaces of the through holes to insulate the plugs 171 and 172 from the heat sink substrate 120. It is not necessary to form the through-hole films 190 on the whole inner surfaces of the through-holes, but it is preferable that they are formed on at least the portions through which the heat sink substrate 120 passes. If the heat sink substrate 120 is formed of an insulating material, through-hole films 190 may be omitted.

The chip base films 160 are formed of an insulating material for insulation between the LED chips 130 and the heat sink substrate 120. The chip base films 160 also have through-holes, and the through-holes are filled with the plugs 171 and 172.

The positive and negative electrodes of the LED chips 130 placed on the chip base film 160 are electrically connected to the plugs 171 and 172 through a flip-chip bonding or wire bonding technique. This will be described later.

The LED chips 130 may be blue LEDs for emitting blue light or blue LEDs for emitting both blue light and ultraviolet light when an appropriate electric signal is applied. The LED chips 130 may also be ultraviolet LEDs for emitting only ultraviolet light, if necessary.

The plurality of LED chips 130 are mounted on the single base substrate 111 and electrically coupled in parallel to each other. That is, a first electrode of each of the LED chips 130 is connected to a particular node, and a second electrode of each of the LED chips 130 is connected to a different node, in order to drive the LED chips 130. For example, one node may be ground, and the other node may be a particular voltage, and LED chips 130 may be driven using the potential difference between the nodes. Therefore, light with higher luminance can be produced, compared with an LED formed with only one LED chip.

The fluorescent material layer 140 is formed of a mixed material with red and green fluorescent materials, and covers the LED chips 130. The fluorescent material layer 140 converts blue light or ultraviolet light emitted from the LED chips 130 into green and red light. If the LED chip 130 is an ultraviolet LED, the fluorescent material layer 140 may further include blue fluorescent material.

The molding resin layer 150 covers the fluorescent material layer 140 to protect the fluorescent material layer 140.

As described above, a high-luminance LED can be obtained by mounting and molding the plurality of LED chips 130 on the single base substrate 111. As a result, it is possible to assure sufficient luminance although a part of the blue or ultraviolet light emitted from the LED chips 130 is converted into green and red light.

Figure 4:
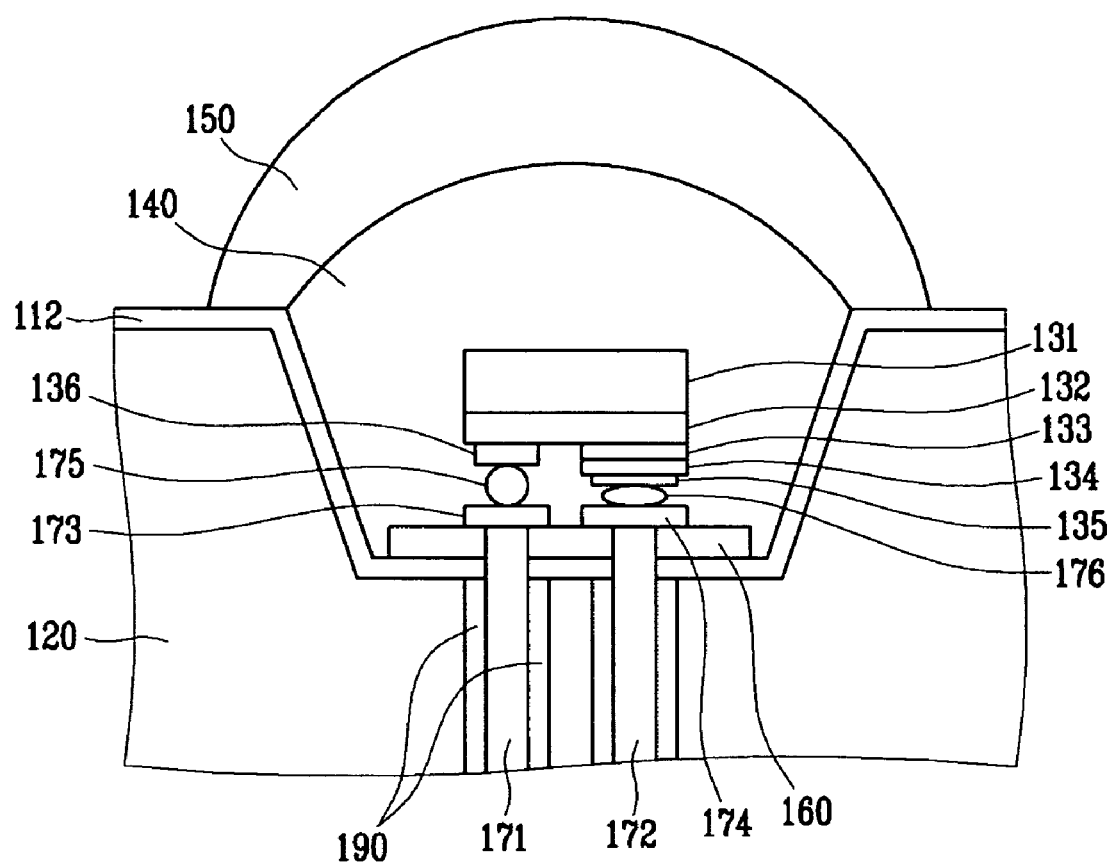
FIG. 4 to FIG. 6 are vertical cross-sectional views illustrating various structures of an LED according to exemplary embodiments of the present invention.
Figure 5:
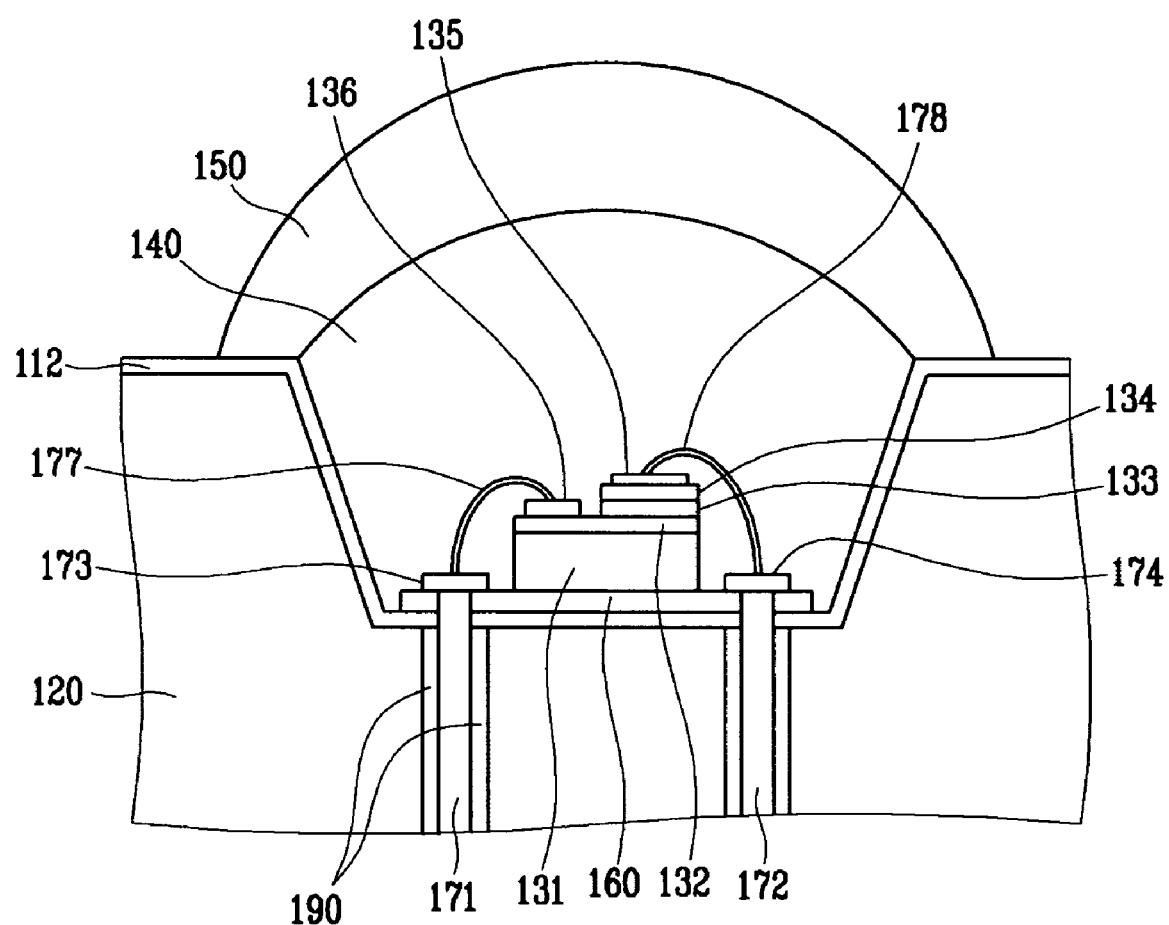
Figure 6:
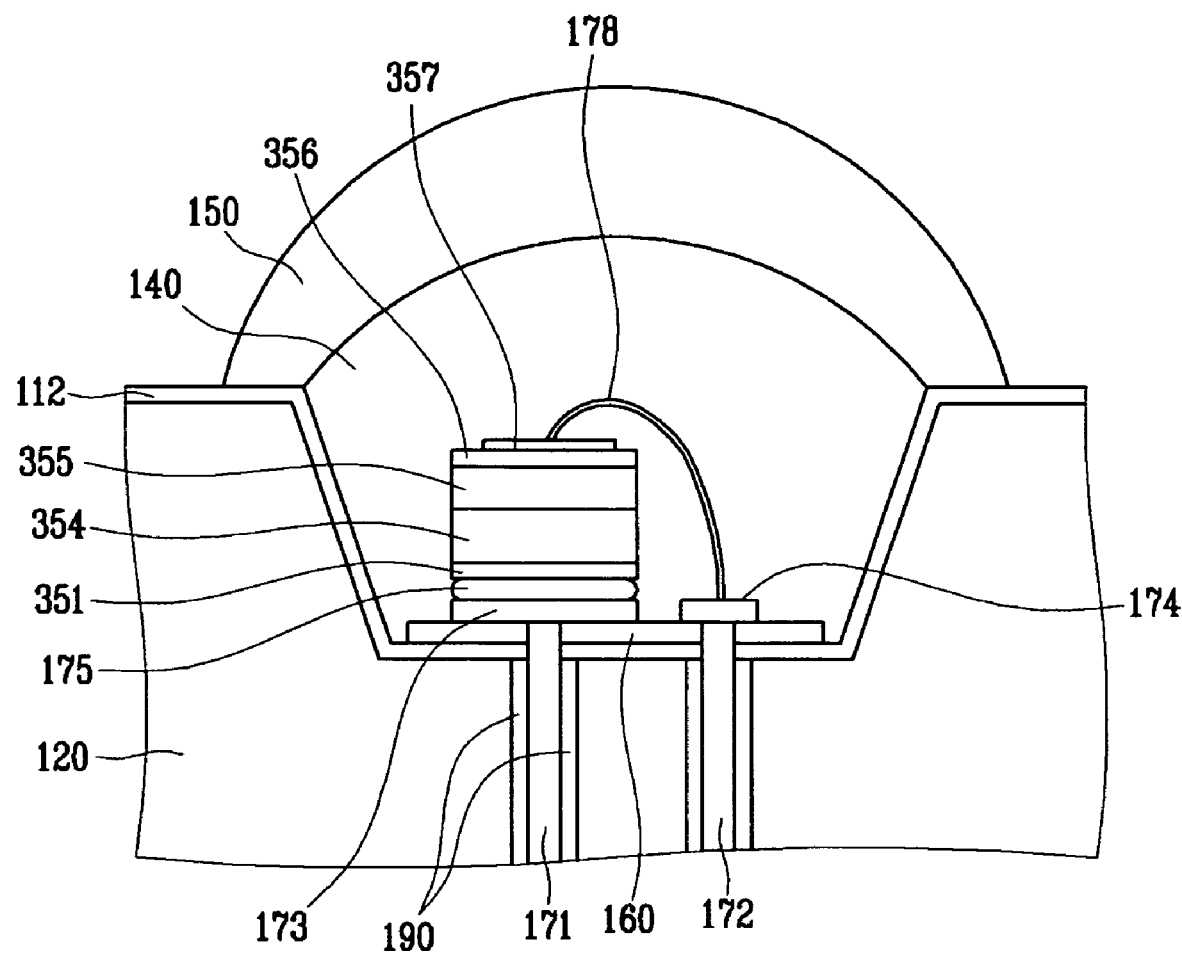

FIG. 4 to FIG. 6 are vertical cross-sectional views illustrating various structures of an LED used for a two dimensional light source in accordance with exemplary embodiments of the present invention.

Referring to FIG. 4, a reflecting film 112 is coated on a heat sink substrate 120, a chip base film 160 is formed on the reflecting film 112 within the groove of the heat sink substrate 120, and an LED chip is flip-chip bonded on plug heads 173 and 174 that are placed on the top of the chip base film 160 through through-holes.

The LED chip includes an insulation substrate 131, an n-type semiconductor layer 132 formed on the insulation substrate 131, an active layer 133 formed on the n-type semiconductor layer 132, a p-type semiconductor layer 134 formed on the active layer 133, and two electrodes 135 and 136 formed on the p-type and n-type semiconductor layers 134 and 132, respectively. The two electrodes 136 and 135 are connected to the plug heads 173 and 174 through conductive bumpers 175 and 176, respectively. As described above, the flip-chip bonding technique refers to a technique for turning over the LED chip and directly connecting the electrodes 135 and 136 to the plug heads 173 and 174 through the conductive bumpers 175 and 176.

Referring to FIG. 5, a reflecting film 112 is coated on a heat sink substrate 120, a chip base film 160 is formed on the reflecting film 112 within the groove of the heat sink substrate 120, and an LED chip is wire bonded on plug heads 173 and 174 that are placed on the top of the chip base film 160 through through-holes.

The LED chip includes an insulation substrate 131, an n-type semiconductor layer 132 formed on the insulation substrate 131, an active layer 133 formed on the n-type semiconductor layer 132, a p-type semiconductor layer 134 formed on the active layer 133, and two electrodes 135 and 136 formed on the p-type and n-type semiconductor layers 134 and 132, respectively. The two electrodes 136 and 135 are connected to the plug heads 173 and 174 through wires 177 and 178, respectively.

As described above, the wire bonding technique refers to a technique for connecting the insulation substrate 131 of the LED chip to the chip base film 160 and connecting the two electrodes 135 and 136 to the plug heads 173 and 174 using the wires 177 and 178.

Referring to FIG. 6, a reflecting film 112 is coated on a heat sink substrate 120, a chip base film 160 is formed on the reflecting film 112 within the groove of the heat sink substrate 120, and one electrode of an LED chip is directly connected through a conductive bumper 175 to a plug head 173 and the other electrode is wire bonded through a wire 178 to plug head 174, where plug heads 173 and 174 are placed on the top of the chip base film 160 through through-holes.

The LED chip includes a first electrode 351, a conductive substrate 354 formed on the first electrode 351, an n-type semiconductor layer 355 formed on the conductive substrate 354, an active layer 356 formed on the n-type semiconductor layer 355, and a second electrode 357 formed on the active layer 356. The first electrode 351 is connected to the plug head 173 through the conductive bumper 175, and the second electrode 357 is connected to the plug head 174 through the wire 178.

As described above, a high luminance white LED can be manufactured by mounting a plurality of LED chips on the single base substrate in parallel to each other and forming the fluorescent material layer thereon, using a wire bonding or flip-chip bonding technique, or a combination thereof.

Figure 7:
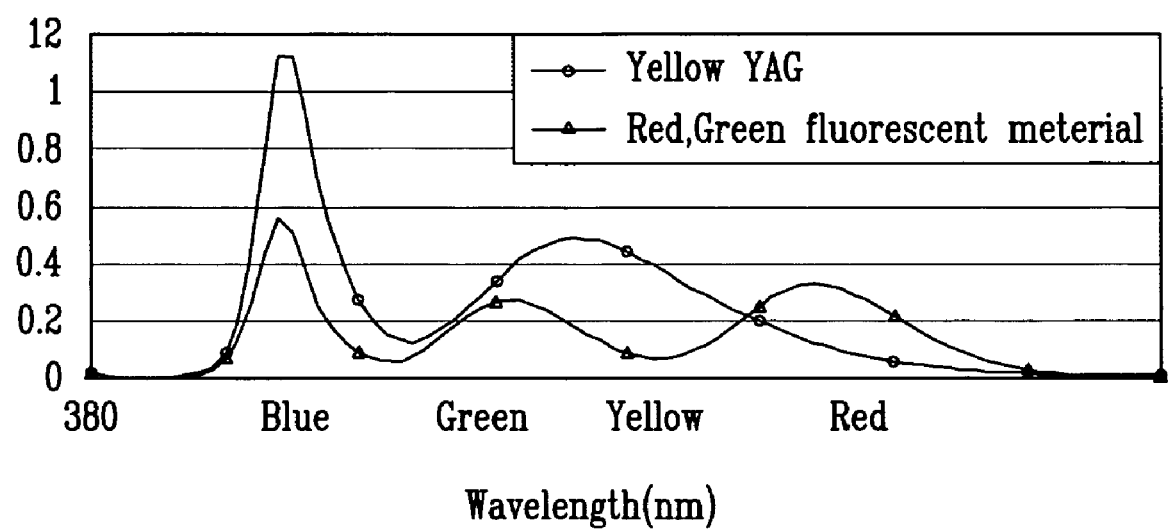
FIG. 7 is a graph illustrating spectrum curves obtained from a blue LED chip employing a yellow YAG fluorescent material and from another blue LED chip employing red and green fluorescent materials.

FIG. 7 is a graph illustrating spectral curves obtained from a blue LED chip employing a yellow YAG fluorescent material and from another blue LED chip employing red and green fluorescent material.

As seen FIG. 7, for the blue LED employing the yellow YAG fluorescent material, peaks appear at a yellow wavelength region that is the middle region between green and red regions, and at a blue region. By contrast, in the case of the blue LED employing the green and red fluorescent materials, peaks appear at the red, green, and blue regions. Thus, compared to the blue LED chip employing yellow YAG fluorescent material, the blue LED chip employing red and green fluorescent materials may have lower luminance, since the total amount of light is lower. On the other hand, the blue LED chip with red and green fluorescent materials may have superior color reproducibility. However, like the exemplary embodiments of the present invention, it is possible to assure sufficient luminance by mounting the plurality of LED chips on the single base substrate and stacking the fluorescent material thereon to manufacture the LED.

As described above, according to embodiments of the present invention, a high luminance LED can be obtained by mounting a plurality of LED chips on a single base substrate and stacking fluorescent material thereon to manufacture the LED.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display device comprising:
    a plurality of light emitting diodes, each of the light emitting diodes comprising, a base substrate having lower surface and upper surface, a plurality of light emitting chips disposed on the upper surface of the base substrate and electrically coupled to one another in parallel;
    a fluorescent material layer covering the light emitting chips;
    a liquid crystal panel that is positioned to receive light from the light emitting diodes and includes two panels and a liquid crystal layer interposed between the two panels; and
    wires formed on the lower surface of the base substrate to electrically connect the at least two light emitting chips in parallel,
    wherein the fluorescent material layer comprises red fluorescent material and green fluorescent material,
    wherein the base substrate comprises a PCB substrate and a heat sink substrate attached on the PCB substrate, and wherein the wires are formed on a lower surface of the PCB substrate and the plurality of light emitting chips are positioned on an upper surface of the heat sink substrate.

2. The liquid crystal display device of claim 1, wherein the base substrate has a plurality of through-holes associated with the plurality of light emitting chips, and wherein each of the light emitting diode further comprises a first plug and a second plug connecting a first electrode and a second electrode of a particular light emitting chip of the plurality of light emitting chips with the wires through one or more through-holes associated with the particular light emitting chip.

3. The liquid crystal display device of claim 2, wherein the heat sink substrate comprises metal.

4. The liquid crystal display device of claim 3, further comprising one or more chip base films formed on the heat sink substrate to insulate the first electrode and the second electrode of the particular light emitting chip from the heat sink substrate.

5. The liquid crystal display device of claim 4, further comprising one or more through-hole films formed on at least a portion of a surface of the one or more through-holes associated with the particular light emitting chip to insulate the first plug and the second plug from the heat sink substrate.

6. The liquid crystal display device of claim 1, wherein the plurality of light emitting chips emit blue light.

7. The liquid crystal display device of claim 1, wherein the plurality of light emitting chips emit blue light and ultraviolet light.

8. The liquid crystal display device of claim 1, further comprising a molding resin layer covering the fluorescent material layer.

9. The liquid crystal display device of claim 1, wherein a plurality of grooves are formed on the upper surface of the base substrate, and wherein one or more of the plurality of light emitting chips are positioned at least partially within an associated groove of the plurality of grooves.

10. The liquid crystal display device of claim 1, further comprising a reflecting layer formed on the upper surface of the base substrate.

11. The liquid crystal display device of claim 1, wherein the liquid crystal panel includes a first side and a second side, and wherein the liquid crystal device further comprises a first polarizer disposed on the first side of the liquid crystal panel and a second polarizer disposed on the second side of the liquid crystal panel.

12. The liquid crystal display device of claim 1, further comprising one or more optical films positioned at least partially between the light emitting diodes and the liquid crystal panel.

* * * * *